United States Patent

Takagi et al.

[11] Patent Number: 5,877,843
[45] Date of Patent: Mar. 2, 1999

[54] EXPOSURE APPARATUS

[75] Inventors: Shin-ichi Takagi, Kawasaki; Naohiko Iwata, Koganei, both of Japan

[73] Assignee: Nikon Corporation, Tokyo, Japan

[21] Appl. No.: 707,218

[22] Filed: Sep. 3, 1996

[30] Foreign Application Priority Data

Sep. 12, 1995 [JP] Japan .................................. 7-259365
Sep. 12, 1995 [JP] Japan .................................. 7-259366
May 27, 1996 [JP] Japan .................................. 8-131776

[51] Int. Cl.$^6$ .......................... G03B 27/42; G03B 27/52
[52] U.S. Cl. ................................ 355/30; 355/53; 355/55
[58] Field of Search .................................. 355/30, 53, 55

[56] References Cited

U.S. PATENT DOCUMENTS

| | | | |
|---|---|---|---|
| 4,704,348 | 11/1987 | Koizumi et al. | 355/30 |
| 4,720,732 | 1/1988 | Tsutsui | 355/30 |
| 4,780,747 | 10/1988 | Suzuki et al. | 355/68 |
| 4,825,247 | 4/1989 | Kemi et al. | 355/55 |
| 4,920,505 | 4/1990 | Suzuki | 355/55 |
| 4,989,031 | 1/1991 | Kamiya | 355/30 |
| 5,025,284 | 6/1991 | Komoriya et al. | 355/55 |
| 5,063,582 | 11/1991 | Mori et al. | 355/30 |
| 5,105,075 | 4/1992 | Ohta et al. | 355/53 |
| 5,270,771 | 12/1993 | Sato | 355/53 |
| 5,337,097 | 8/1994 | Suzuki et al. | 355/55 |
| 5,710,620 | 1/1998 | Taniguchi | 355/53 |

*Primary Examiner*—R. L. Moses
*Assistant Examiner*—Shival P. Virmani
*Attorney, Agent, or Firm*—Oliff & Berridge, PLC

[57] ABSTRACT

A scanning type exposure apparatus, which is used to expose a wafer with an image of a pattern on a reticle by synchronously moving the reticle and the wafer, comprises a second gas conditioner for circulating a temperature-controlled gas in a subsidiary chamber which encloses an optical path of an interferometer for measuring a position of a reticle stage. The apparatus comprises a third gas conditioner for supplying a temperature-controlled gas to an internal space of a pedestal including a wafer stage and an optical path of an interferometer for measuring a position of the wafer stage. A positional error of the stage, which would be otherwise caused by temperature-dependent fluctuation of the gas on the optical path of the interferometer, is reduced. A heat insulating material is installed on a top plate of the pedestal so as to intercept heat transfer from a heat source on the pedestal to the internal space of the pedestal. A tube may be arranged in the pedestal so that a temperature of the pedestal is adjusted by allowing a temperature-controlled fluid to flow therethrough.

49 Claims, 11 Drawing Sheets

EXPOSURE APPARATUS

FIELD OF THE INVENTION

The present invention relates to a projection exposure apparatus for producing semiconductor integrated circuits and liquid crystal devices. In particular, the present invention relates to a scanning type projection exposure apparatus comprising a partition wall for enclosing a space including a mask stage and an optical path of an interferometer and having an air-conditioning or gas-conditioning system for independently air-conditioning or gas-conditioning the space.

BACKGROUND OF THE INVENTION

A projection exposure apparatus is used as an apparatus to form a circuit pattern of a semiconductor integrated circuit or a liquid crystal substrate on a semiconductor wafer in accordance with a photolithography technique. In such a projection exposure apparatus, a reticle (mask) is irradiated with an illuminating light beam radiated from an illuminating system so that an image of a reticle pattern is formed on a photosensitive substrate through a projection optical system. Such an apparatus is required to have highly accurate image formation characteristics in order to form a fine circuit pattern. Further, in order to expose an identical area on a substrate with a plurality of patterns to be overlaid thereon, such an apparatus is required to have a high degree of overlay accuracy between a layer to be subjected to exposure process and a layer having been previously subjected to exposure process. On the other hand, the projection optical system comprising a group of a plurality of lens elements suffers change in image formation characteristics such as magnification depending on ambient temperature. Accordingly, the apparatus is required to have stability regardless of ambient temperature in order to maintain the highly accurate image formation characteristics and the overlay characteristic as described above. For this reason, the projection exposure apparatus has been hitherto installed in a temperature-controlled constant temperature chamber. In order to prevent the projection exposure apparatus from adhesion of dust or the like in the chamber, for example, a chamber of the so-called down flow type is adopted, in which temperature-controlled air is allowed to flow from a ceiling of the chamber in a direction parallel to an optical axis of the projection optical system.

Now, a step-and-scan exposure method has been contrived, in which a slit-shaped rectangular area for a projection optical system is illuminated to perform exposure while relatively scanning a reticle and a photosensitive substrate. FIG. 12 schematically shows a scanning type exposure apparatus based on the use of this exposure system. This apparatus principally comprises an illuminating optical system (not shown) including a light source for irradiating a reticle R with a uniform illuminating light beam, a reticle stage RST for moving the reticle R in a scanning direction (X direction), a projection optical system PL for projecting an image of a pattern formed on the reticle R onto a wafer W at a predetermined reduction magnification, and a wafer stage WST for moving the wafer W in synchronization with the reticle R. In such an arrangement, the reticle R is illuminated with the uniform illuminating light beam collected through a condenser lens 3. The reticle stage RST, on which the reticle R is placed, is moved in the scanning direction with respect to an illumination area on the reticle R. In synchronization with the movement of the reticle stage RST, the wafer stage WST, on which the wafer W is placed, is moved in a direction opposite to the direction of the movement of the reticle stage RST. In accordance with the scanning for the reticle R across the slit-shaped illumination area, an exposure area on the wafer W is successively exposed with the reduced image of the pattern on the reticle R, formed through the projection optical system PL. According to this system, an area having a wide areal size can be exposed without enlarging the field size of the projection optical system. Moreover, only a part of the projection optical system is used for exposure. Therefore, this system is more excellent than other exposure systems in that it is easy to adjust, for example, distortion and uniformity of illuminance.

This apparatus has a chamber 1 which is a chamber of the down flow type as described above. Temperature-controlled air flows in a direction indicated by arrows in FIG. 12 from an air-blowing port 2 provided on a ceiling of the chamber 1. However, this apparatus includes the reticle stage RST which moves reciprocatively in the horizontal direction (X direction) over the projection optical system PL. Therefore, the way of flow of air going toward the projection optical system PL greatly changes depending on the position of the reticle stage RST. On the other hand, for example, a laser beam source for an interferometer, which serves as a heat source, is usually arranged in the vicinity of the projection optical system PL. Therefore, variation occurs in the temperature of the projection optical system PL itself, and in the temperature of air on an optical path between the reticle R and the projection optical system PL. As a result, a problem arises in that the image formation characteristics of the projection optical system PL change. The exposure apparatus of this type comprises the interferometer 6 for observing a reflected light beam from a movement mirror 5 fixed on the reticle stage RST in order to measure the position of the movable reticle stage RST. If the air flow in the vicinity of the reticle stage RST suffers variation, temperature-dependent fluctuation occurs in air on an optical path of the light beam radiated from the interferometer 6. Therefore, an error occurs in measurement of the position of the stage. As a result, a synchronization discrepancy is brought about in the movement of the reticle stage RST and the wafer stage WST. Further, the movement of the reticle stage RST also causes variation in reticle temperature as well as adhesion of dust or the like to the reticle R. These problems are inherent in the scanning type exposure apparatus comprising the reticle stage which is moved for the purpose of scanning.

Usually, as for projection exposure apparatuses of the collective exposure type and the scanning type, a projection optical system is supported by a pedestal fixed on a base plate of an apparatus, through a flange or the like provided on a barrel of the projection optical system. A wafer stage for holding a wafer (photosensitive substrate) and moving it in a scanning direction is installed in a space inside the pedestal. An optical path of an interferometer for irradiating a movement mirror installed at an end of the wafer stage with a laser beam and measuring a distance on the basis of a reflected light beam thereof is also included in the pedestal. A projection exposure apparatus has been hitherto known, which includes, in the space inside the pedestal, an air-conditioning system exclusively used for the inside of the pedestal, for supplying air having the same temperature as a temperature of an air-conditioning system used for the entire apparatus.

However, a laser beam source for such an interferometer, an electric substrate, and a control box are placed on a top plate of the pedestal. They may serve as heat sources in the apparatus. Further, the projection optical system supported by the pedestal also generates heat because the illuminating light beam is transmitted therethrough. Therefore, the surface temperature of the top plate of the pedestal is higher than a set temperature in a constant temperature chamber by about 0.5° to 1.5° C. Accordingly, in the space inside the pedestal, a portion of the space located inside with respect to the top plate of the pedestal, which contacts with the top plate of the pedestal, has a temperature higher than a temperature of central and lower portions of the space inside the pedestal. As a result, a temperature gradient is produced in the internal space of the pedestal. The temperature gradient causes temperature-dependent fluctuation in air (variation in refractive index) on the optical path of the interferometer. Thus an error of about several tens of nm is produced in a distance-measuring result concerning the wafer stage measured by the interferometer. The distance-measuring error of the interferometer causes an error concerning an irradiation position of a shot area on the wafer. The distance-measuring error also arises a problem of synchronization error in movement of the reticle stage and the wafer stage in the case of the scanning type projection exposure apparatus, which seriously affects image formation characteristics of an image of a reticle pattern formed on the wafer.

The projection exposure apparatus includes an alignment system for certainly executing overlay exposure. The alignment system includes a highly accurate and highly sensitive optical system such as an alignment microscope for detecting an alignment mark on the photosensitive substrate. Accordingly, the alignment system tends to be affected by the temperature-dependent fluctuation on its optical path, caused by the heat source such as an electric substrate as described above.

In the conventional apparatus, those which serve as the heat source such as an electric substrate, a light source box, and a control box are arranged outside the apparatus, or installed in a floating state to be separated from a main apparatus body. Alternatively, a local heat-exhausting mechanism is provided for such a heat source. Thus it is intended to suppress and minimize the influence of heat generated by the heat source, on the distance-measuring system and the alignment system.

However, those which serve as the heat source such as an electric substrate, a power source box, and a control box include those which should be arranged in the vicinity of a sensor in order to reduce noise, and those which should be installed on the main apparatus body, such as a laser head of a laser interferometer, in order not to deviate a relative position with respective to a measurement objective. Therefore, it is impossible to install all heat sources outside the apparatus, or install them in a floating state to be separated from the apparatus.

Even when a local heat-exhausting mechanism is provided for a unit which serves as a heat source, as provided in the conventional apparatus, the heat generated by the heat source warms air and components located in the vicinity of the heat source. Therefore, change in temperature and unevenness in temperature occur in a unit required to be precisely temperature-controlled, and in ambient air in the vicinity thereof. Thus results of measurement obtained by the distance-measuring system and the alignment system are badly affected due to fluctuation of air.

SUMMARY OF THE INVENTION

A first object of the present invention is to solve the foregoing problems concerning the conventional scanning type exposure apparatuses, and provide a scanning type exposure apparatus which makes it possible to avoid variation in air flow in a chamber, produced by movement of a reticle stage.

A second object of the present invention is to provide a scanning type exposure apparatus which makes it possible to reduce variation in gas temperature in the vicinity of a reticle stage including an optical path of an interferometer for measuring a position of the reticle stage and an optical path between a mask and a projection optical system, reduce measurement error of the interferometer, and give stable image formation characteristics of the projection optical system.

A third object of the present invention is to provide a projection exposure apparatus provided with a mechanism which makes it possible to avoid temperature-dependent fluctuation in a stage space inside a pedestal for installing a substrate stage therein.

A fourth object of the present invention is to provide a projection exposure apparatus having a structure which makes it possible to avoid heat transfer from a heat source installed on a pedestal to a stage space inside the pedestal.

According to a first aspect of the present invention, there is provided a scanning type exposure apparatus for transferring an image of a pattern formed on a mask onto a photosensitive substrate by synchronously scanning the mask and the photosensitive substrate with respect to an illumination area on the mask while illuminating the mask including the pattern formed thereon, the apparatus comprising a chamber for accommodating the apparatus, a first gas conditioner for allowing a temperature-controlled gas to flow in the chamber, a mask stage for holding and moving the mask, and a partition wall for intercepting the gas which would otherwise go toward the mask on the mask stage. The mask stage is isolated by the partition wall from a gas flow for gas-conditioning the chamber. Accordingly, it is possible to prevent, for example, the mask stage from adhesion of dust or the like, and it is possible to avoid change in temperature of the reticle, which would be otherwise caused by movement of the reticle stage.

According to a second aspect of the present invention, there is provided a scanning type exposure apparatus for transferring an image of a pattern formed on a mask onto a photosensitive substrate by synchronously scanning the mask and the photosensitive substrate with respect to an illumination area on the mask while illuminating the mask including the pattern formed thereon, the apparatus comprising a chamber for accommodating the apparatus, a first gas conditioner for allowing a temperature-controlled gas to flow in the chamber, a mask stage for holding and moving the mask, an optical measuring unit for measuring a position of the mask stage, a partition wall for intercepting the gas which would otherwise go toward the mask stage and an optical path of the optical measuring unit, and a second gas conditioner for allowing a temperature-controlled gas to flow in a space partitioned by the partition wall and including the mask stage and the optical path of the optical measuring unit. The mask stage and the optical path of the optical measuring unit are isolated by the partition wall from a gas flow for gas-conditioning the chamber. Accordingly, it is possible to prevent, for example, the mask stage from adhesion of dust or the like, and it is possible to avoid change of the air flow in the chamber, which would be otherwise caused by movement of the reticle stage. Further, the temperature-controlled gas is supplied by the second gas conditioner to the space partitioned by the partition wall and including the mask stage and the optical path of the optical measuring unit. Thus temperature-dependent fluctuation of the gas on the optical path of the beam of the optical measuring unit is reduced, making it possible to accurately measure the position of the reticle stage.

Preferably, the scanning type exposure apparatus according to the present invention further comprises a projection optical system for projecting the image of the pattern formed on the mask onto the photosensitive substrate, wherein an optical path between the projection optical system and the mask is enclosed by the partition wall. According to this preferred embodiment, the variation in refractive index of the gas on the optical path between the projection optical system and the mask is reduced, and image formation characteristics of the projection optical system are stabilized.

The mask stage and the optical path of the beam of the optical measuring unit may be substantially enclosed by the partition wall, and a part of the partition wall may be composed of a member which is substantially transparent with respect to an illuminating light beam for illuminating the mask so that the mask is irradiated with the illuminating light beam.

In the scanning type exposure apparatus according to the present invention, the first gas conditioner may be a gas conditioner of the so-called down flow type which allows the gas to flow from a position above the mask substantially in parallel to an optical axis of the projection optical system. The scanning type projection exposure apparatus, which adopts the gas conditioner of the down flow type, suffers large change in air flow going toward the projection optical system, caused by movement of the reticle stage. However, the change in air flow can be avoided by enclosing the reticle stage with the partition wall.

According to a third aspect of the present invention, there is provided a projection exposure apparatus comprising:

a projection optical system for projecting an image of a pattern formed on a mask onto a photosensitive substrate;

a pedestal for supporting the projection optical system in the projection exposure apparatus;

a substrate stage arranged in an internal space of the pedestal, the substrate stage being capable of holding and moving the photosensitive substrate;

an optical measuring unit for measuring a position of the substrate stage; and a third gas conditioner for supplying a gas controlled to have a temperature which is substantially the same as a temperature of a pedestal surface contacting with the internal space, to the internal space of the pedestal including the substrate stage and an optical path of the optical measuring unit. The temperature-controlled gas is supplied to the inside of the pedestal by using the third gas conditioner so that the temperature of the internal space of the pedestal may be made substantially the same as the temperature of the inner side surface of a top plate of the pedestal, and the temperature of the internal space of the pedestal may be uniformalized inside the pedestal. Preferably, the projection exposure apparatus according to the present invention further comprises a temperature sensor provided on a pedestal surface contacting with the space described above. It is possible to supply the gas having a temperature which is substantially coincident with a temperature of the pedestal surface measured by the temperature sensor. The temperature of the gas may be set to be an average value of temperatures measured at a plurality of positions on the pedestal surface contacting with the space described above. The temperature differs depending on the position on the inner pedestal surface because various heat sources such as a light source for an interferometer and an electric substrate exist on a top plate of the pedestal. Therefore, it is preferred to measure temperatures of respective positions by using a plurality of the same temperature sensors as defined above so that the temperature of the gas to be supplied is set to be an average temperature of them. Especially, in order to avoid temperature-dependent fluctuation in the vicinity of an optical path of the interferometer, it is preferred that a plurality of the temperature sensors are arranged between the third gas conditioner and the vicinity of the optical path of the interferometer, and the temperature of the gas is set to be an average temperature of measured temperatures obtained by them.

According to a fourth aspect of the present invention, there is provided a projection exposure apparatus comprising:

a projection optical system for projecting an image of a pattern formed on a mask onto a photosensitive substrate;

a pedestal for supporting the projection optical system in the projection exposure apparatus;

a substrate stage arranged in an internal space of the pedestal, the substrate stage being capable of holding and moving the photosensitive substrate;

an optical measuring unit for measuring a position of the substrate stage; and a heat insulating material, provided on at least a part of the pedestal, for intercepting heat transfer from the outside to the internal space including the substrate stage and an optical path of the optical measuring unit. According to the present invention, installation of the heat insulating material on a surface such as a surface of a top plate of the pedestal makes it possible to suppress heat transfer to the internal space of the pedestal from heat sources installed on the pedestal, such as a light source of the optical measuring unit and an electric substrate for controlling movement of the substrate stage. Accordingly, it is possible to avoid temperature-dependent fluctuation which would be otherwise caused on the optical path of the optical position-measuring unit such as an interferometer. The heat insulating material may be provided on a substantially entire surface of the pedestal at the back of the internal space.

According to a fifth aspect of the present invention, there is provided a projection exposure apparatus comprising:

a mask-supporting mechanism for supporting a mask;

a projection optical system for projecting an image of a pattern formed on the mask onto a photosensitive substrate;

a pedestal for supporting the projection optical system in the projection exposure apparatus;

a substrate stage arranged in an internal space of the pedestal, the substrate stage being capable of holding and moving the photosensitive substrate;

an optical measuring unit for measuring a position of the substrate stage; and a temperature-adjusting unit for adjusting at least one of a temperature of the mask-supporting mechanism and a temperature of the pedestal. The temperature of the pedestal itself can be maintained to be constant, for example, by forming a flow passage for a temperature-controlled fluid in a top plate of the pedestal, and supplying the temperature-controlled fluid to the flow passage. Alternatively, a flow passage for a temperature-controlled fluid is formed in the vicinity of at least a portion of the mask-supporting mechanism at which the mask is supported, for example, in a mask holder or an upper portion of the pedestal. It is possible to avoid increase in temperature of the mask during exposure by supplying the temperature-controlled fluid to the flow passage. Accordingly, it is possible to effectively avoid temperature-dependent fluctuation on an optical path of an interferometer for the mask stage or the substrate stage.

DETAILED DESCRIPTION OF PREFERRED EMBODIMENTS

Embodiments of the scanning type exposure apparatus according to the present invention will be explained below with reference to accompanying drawings.

First Embodiment

Figure 1:
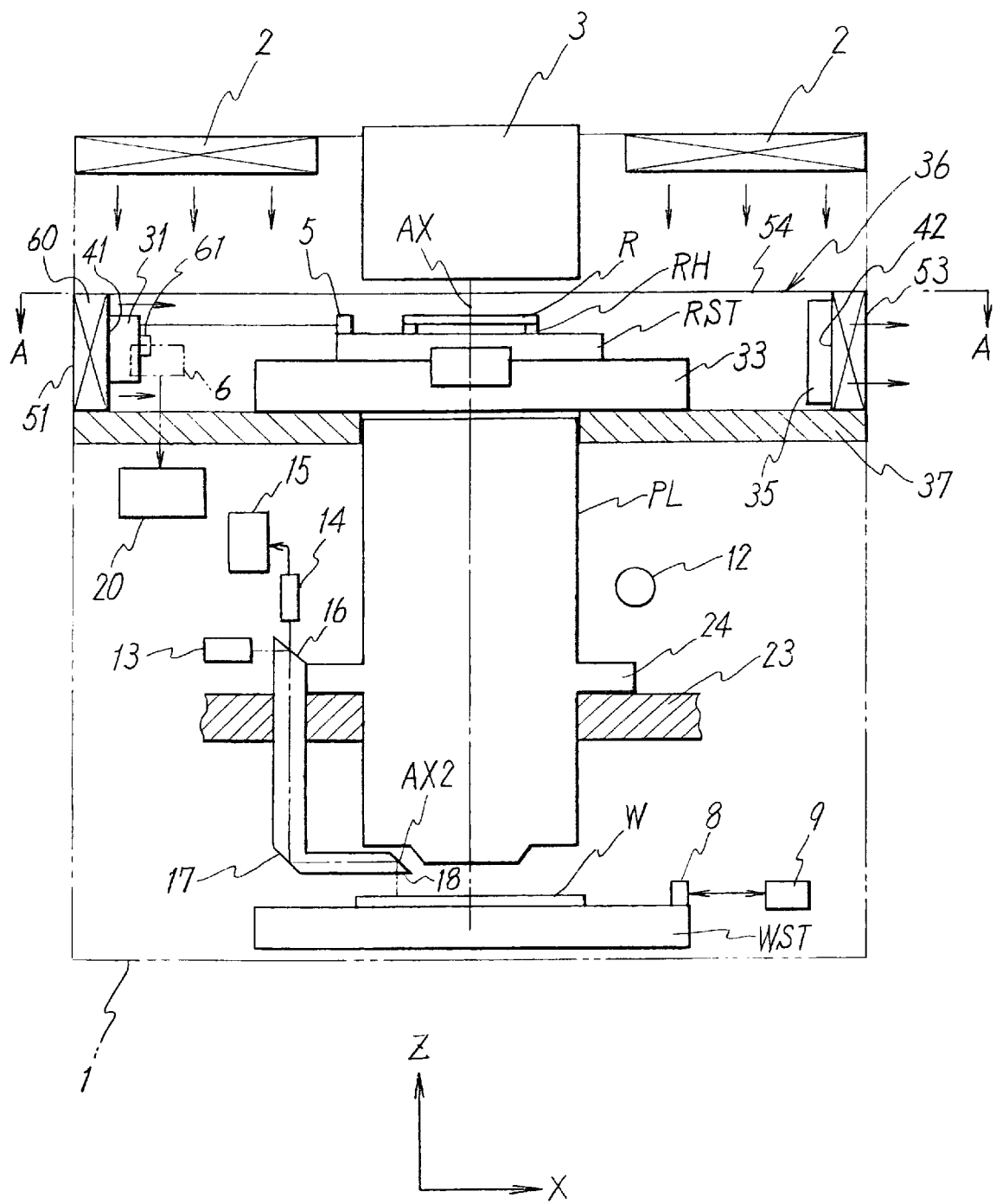
FIG. 1 schematically shows a scanning type exposure apparatus according to a first embodiment of the present invention, having a structure in which a reticle stage is accommodated in a temperature-controlled subsidiary chamber.

FIG. 1 exemplarily shows a scanning type projection exposure apparatus for performing exposure while synchronously scanning a reticle R and a wafer W with respect to an illumination area on the reticle R. As shown in FIG. 1, the projection exposure apparatus is generally installed in a constant temperature chamber 1. The temperature is controlled more accurately in the constant temperature chamber 1 than in an ordinary clean room. For example, the temperature is controlled in the clean room in a range of ±2° to ±3° C., while the temperature is kept in the constant temperature chamber 1 in a range of about ±0.1° C. The illustrated projection exposure apparatus is a projection exposure apparatus of the down flow type. Air flow-blowing ports 2 are installed on a ceiling of the chamber 1 in order to prevent the apparatus from adhesion of particles flowing in the air. A temperature-controlled air flow flows from the blowing ports 2 in a direction toward a floor of the chamber along an optical axis of a projection optical system PL. In order to prevent the inside of the chamber 1, especially a main exposure apparatus body including the projection optical system PL from inflow of, for example, contaminants (dust), sulfate ion, and ammonium ion floating in the clean room, a HEPA (or ULPA) filter and a chemical filter are arranged in the vicinity of an air intake port or the blowing ports 2 of the chamber 1.

The main scanning type exposure apparatus body shown in FIG. 1 principally comprises, for example, a light source (not shown), an illuminating optical system (not shown), a reticle stage RST for moving the reticle R in a scanning direction, the projection optical system PL, a wafer stage WST for moving the wafer W, and an alignment system (13 to 18) for positional adjustment for the wafer W. Those usable as the light source generally include, for example, a bright line (g-ray, i-ray) in an ultraviolet region of a mercury lamp, and an excimer laser beam such as KrF or ArF. The illuminating optical system comprises, for example, a fly's eye lens and a condenser lens. The light beam finally passes through the condenser lens 3 to irradiate the reticle R therewith. The reticle R, which is a mask including a circuit pattern or the like depicted thereon, is illuminated with the illuminating light beam from the light source at a substantially uniform illuminance and at a predetermined solid angle by the aid of the illuminating optical system. The unillustrated light source and the unillustrated illuminating optical system are arranged over the reticle stage RST in FIG. 1. The light source is arranged outside the chamber 1.

Figure 2:
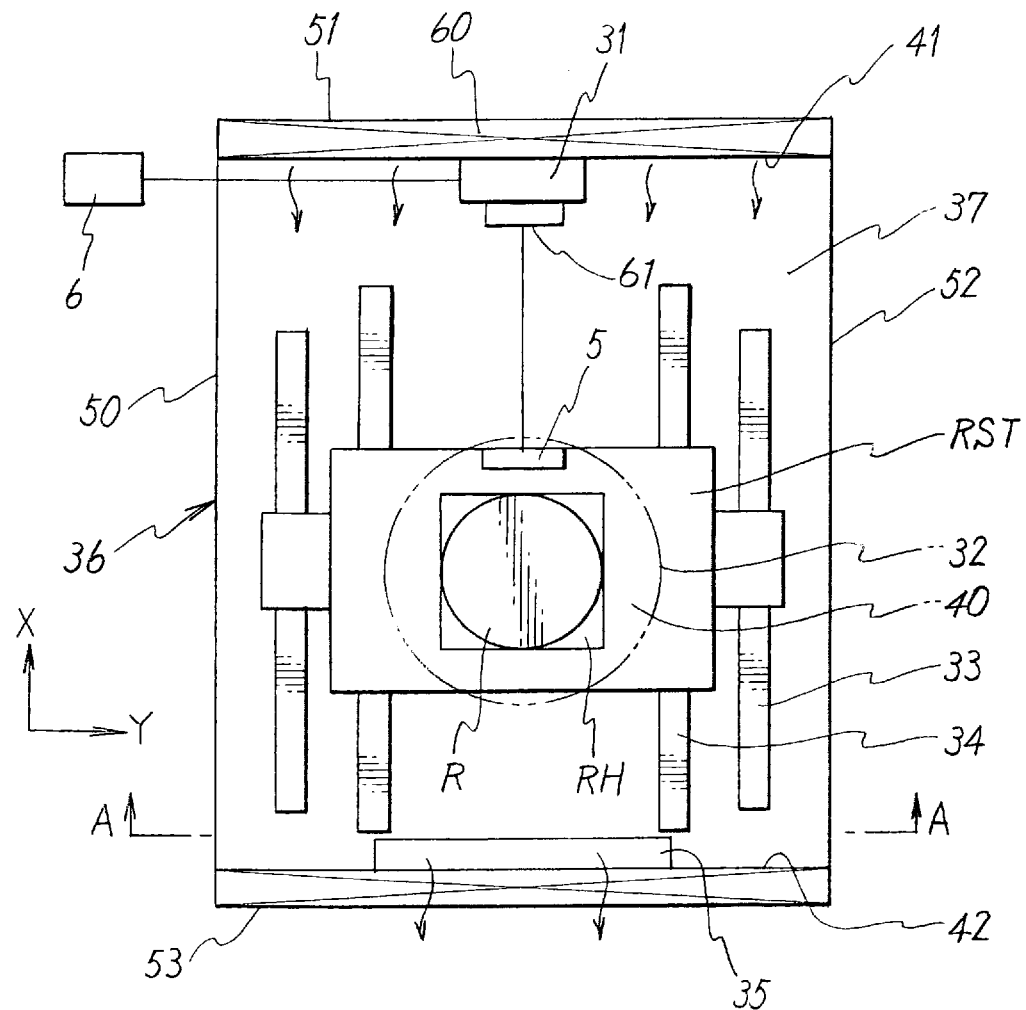
FIG. 2 shows the reticle stage RST accommodated in the subsidiary chamber, as viewed in a direction indicated by arrows AA in FIG. 1.
Figure 3:
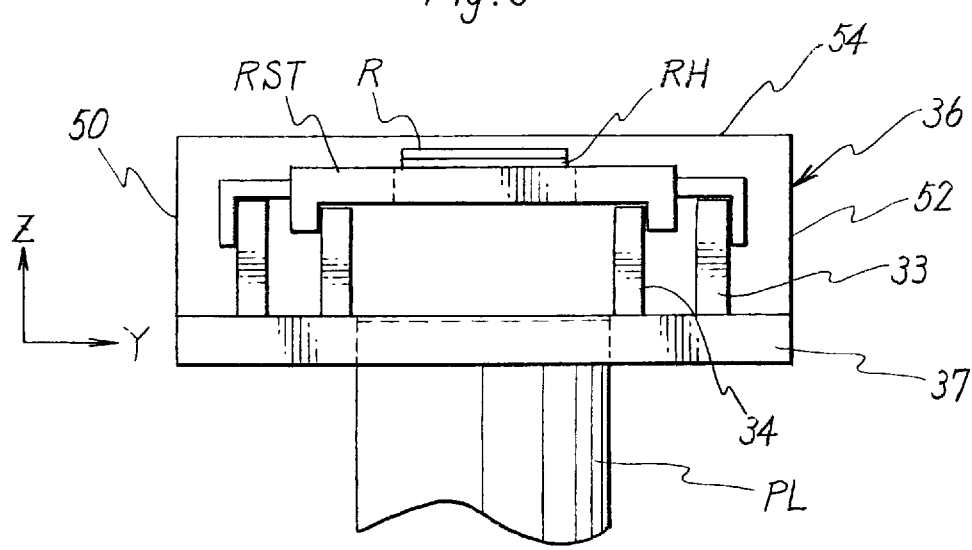
FIG. 3 shows a side view of the reticle stage accommodated in the subsidiary chamber of the scanning type exposure apparatus shown in FIG. 1.

The reticle stage RST is installed on an optical axis AX of the projection optical system PL and between the condenser lens 3 and the projection optical system PL. FIGS. 2 and 3 show a plan view of the reticle stage RST and a view as viewed in a direction indicated by arrows AA in FIG. 2 respectively. The reticle stage RST is supported by guides 34 fixed on a base plate 37 and extending in the X direction. The reticle stage RST is movable in the scanning direction (X direction) at a predetermined velocity by the aid of linear motors 33 extending in parallel to the guides 34 on the base plate 37. The reticle stage RST is movable in the direction of the guides at a stroke sufficient for an entire surface of the pattern area on the reticle R to traverse at least the optical axis AX of the projection optical system. The reticle stage RST is provided with a movement mirror 5 fixed at an end thereof in the X direction for reflecting a laser beam radiated from an interferometer 6. The laser beam coming from the interferometer 6 is divided into two beams by a beam splitter 31 installed on the base plate 37. The two beams go toward the movement mirror 5 and a fixed mirror 61 installed in contact with the beam splitter 31 respectively. A phase difference between reflected light beams from the movement mirror 5 and the fixed mirror 61 is measured by the interferometer 6. Thus the position of the reticle stage RST in the scanning direction is measured, for example, in a unit of 0.01 μm. A result of measurement obtained by the interferometer 6 is fed to a stage control system 20 so that the reticle stage RST is always positioned with a high degree of accuracy. A reticle holder RH is installed on the reticle stage RST. The reticle R is placed on the reticle holder RH. The reticle R is attracted and held by the reticle holder RH by the aid of an unillustrated vacuum chuck.

The scanning type exposure apparatus of the present invention includes a subsidiary chamber 36 on the base plate 37 on which the reticle stage RST is placed. The subsidiary chamber 36 is constructed by partition walls 50 to 54, for accommodating the reticle stage RST. The reticle stage RST in the subsidiary chamber 36 is isolated from the flow of air for air-conditioning the chamber 1. The subsidiary chamber 36 is a rectangular parallelepiped with its long side extending in the scanning direction (X direction) of the reticle stage RST. A bottom surface of the subsidiary chamber 36 is formed by the base plate 37 for supporting the reticle stage RST. An opening 32 (indicated by a phantom line in FIG. 2) is formed through a ceiling (partition wall 54) of the subsidiary chamber 36. A circular glass plate 40 is fitted to the opening 32. The illuminating light beam from the illuminating optical system passes through the glass plate 40 to irradiate the reticle R therewith. The glass plate 40 may be omitted provided that the size of the opening 32 is of a degree at which the illuminating light beam toward the reticle R is not intercepted, and the gas flow in the subsidiary chamber 36 is not affected. A blower 60 and a gas-blowing port 41 for supplying a temperature-controlled gas to the inside of the subsidiary chamber 36 are provided on one partition wall (side wall) 51 disposed in the longitudinal direction (X direction) of the subsidiary chamber 36. A temperature control mechanism (not shown), which is attached inside the blower 60, is used to control the temperature of the gas supplied to the inside of the subsidiary chamber 36. The temperature of the gas is controlled to be the same as the temperature of the air for air-conditioning the chamber 1. The gas is supplied from the blower 60 in a flow amount so that the pressure of the gas in the subsidiary chamber 36 is slightly higher than the pressure of the air outside the subsidiary chamber. Air may be used as the gas. However, it is preferable to use nitrogen or helium gas when a far ultraviolet laser beam is used as the illuminating light beam. A HEPA filter and a chemical filter are installed at the gas-blowing port 41 so that the subsidiary chamber 36 is prevented from inflow of contaminants. The partition wall 53, which is opposed to the partition wall 51, includes a gas-discharging port 42. The gas passed through the subsidiary chamber 36 is discharged from the discharging port 42, and then the gas is recycled to the blower 60 through the outside of the chamber 1. The gas is temperature-controlled, and supplied to the inside of the subsidiary chamber 36 again. An open-and-shut window 35 is formed through the partition wall 53, which is opened when the reticle R is imported into or exported from the reticle stage RST.

As shown in FIG. 2, optical paths between the beam splitter 31, the movement mirror 5, and the fixed mirror 61 are included in the subsidiary chamber 36. If any temperature-dependent fluctuation occurs in the gas on the optical paths, an error arises in a result of measurement of the position of the reticle stage obtained by the interferometer 6. However, such temperature-dependent fluctuation does not occur in the exposure apparatus of the present invention because the subsidiary chamber 36 for enclosing the optical paths is provided, and the gas having a constant temperature is supplied to the inside of the subsidiary chamber 36.

With reference to FIG. 1, the reticle R is irradiated on the reticle stage RST with a rectangular (slit-shaped) illumination area with its long side extending in a direction (Y direction) perpendicular to the scanning direction (X direction) of the reticle R. The illumination area is defined by a field diaphragm (not shown) arranged in a plane conjugate to the reticle R or in the vicinity thereof over the reticle stage.

The illuminating light beam passed through the reticle R comes into the projection optical system PL, and an image of a circuit pattern formed on the reticle R is formed on the wafer W by the aid of the projection optical system PL. As shown in FIG. 1, an opening is formed at a central portion of the base plate 37 which constitutes the subsidiary chamber 36. The projection optical system PL is fitted to the opening at its top. Such a structure constructed as described above allows the optical path from the reticle R to the projection optical system PL to be temperature-controlled by the gas flowing in the subsidiary chamber 36. Accordingly, it is possible to obtain stable image formation characteristics based on the use of the projection optical system PL.

The projection optical system PL accommodates a plurality of lens elements to use the optical axis AX as a common optical axis. The projection optical system PL is provided with a flange 24 at its central portion of its outer circumference in the direction of the optical axis. The projection optical system PL is secured to a pedestal 23 of the main exposure apparatus body by the aid of the flange 24.

The image of the pattern on the reticle R, which is projected onto the wafer W, has a projection magnification determined by a magnification and an arrangement of the lens elements. The reticle pattern in the slit-shaped illumination area (with its center substantially coincident with the optical axis AX) on the reticle R is projected onto the wafer W through the projection optical system PL. The wafer W and the reticle R are in a relationship of inverted image through the projection optical system PL. Accordingly, when the reticle R is scanned at a velocity Vr during exposure in the −X direction (or +X direction), the wafer is scanned at a velocity Vw in synchronization with the reticle R in the +X direction (or −X direction) opposite to the direction of the velocity Vr. Thus an entire surface of a shot area on the wafer W is successively exposed with the pattern on the reticle R. The ratio between the scanning velocities (Vr/Vw) is determined by the reduction magnification of the projection optical system PL.

The wafer W is vacuum-attracted by a wafer holder (not shown) held on the wafer stage WST. The wafer stage WST is not only movable in the scanning direction (X direction) described above, but also movable in the direction (Y direction) perpendicular to the scanning direction so that a plurality of shot areas on the wafer W are exposed by scanning respectively. The wafer stage WST repeats the operation to scan each of the shot areas on the wafer W and the operation to move to an exposure start position of the next shot area. The wafer stage WST is driven by a wafer stage-driving unit (not shown) such as a motor. The wafer stage WST undergoes control of its movement velocity in accordance with the ratio Vr/Vw described above, and it is moved in synchronization with the reticle stage RST. A movement mirror 8 is secured to an end of the wafer stage WST. A laser beam coming from an interferometer 9 is reflected by the movement mirror 8, and its reflected light beam is detected by the interferometer 9. Thus the coordinate position of the wafer stage WST in the XY plane is always monitored.

The projection exposure apparatus includes a wafer alignment system for detecting a position of a positional adjustment mark on the wafer W and determining a position of the wafer upon overlay exposure in order to overlay-expose the wafer W with a plurality of patterns with a high degree of accuracy. The projection exposure apparatus includes, as such a wafer alignment system, the optical alignment system 13 to 18 provided separately from the projection optical system PL. An alignment mark on the wafer W is irradiated with a laser beam radiated from a light source 13 through an optical system 16, 17, 18, and its reflected light beam is detected by a light-receiving unit 14.

In the scanning type exposure apparatus as described above, the reticle stage RST is moved in the scanning direction during actual exposure. However, the reticle stage RST is enclosed by the subsidiary chamber 36. Accordingly, regardless of the position of the movement of the reticle stage RST, the air flow from the air-blowing ports 2 of the chamber steadily flows toward the projection optical system PL.

In the foregoing embodiment, the subsidiary chamber 36 for accommodating the reticle stage RST has the structure in which the subsidiary chamber 36 is tightly sealed and isolated from the inside of the chamber by providing the gas-blowing port 41 and the discharging port 42 on the partition walls 51, 53. However, the subsidiary chamber 36 enclosed by the partition walls 50 to 54 may be allowed to communicate with the inside of the chamber 1 without providing the partition walls 51, 53 on condition that the gas flow in the subsidiary chamber 36 is not substantially affected by the air-conditioning system for the chamber 1. In this arrangement, it is necessary to use an identical type of gas for the gas supplied to the inside of the subsidiary chamber 36 and the gas for gas-conditioning the chamber 1. In the foregoing embodiment, air is used as the gas for gas-conditioning the chamber 1. However, it is possible to use a gas other than air. Especially, for example, when a laser beam having a short wavelength in an ultraviolet region is used as the light source, it is desirable to use an inert gas such as nitrogen or helium gas in order to avoid production of excited state oxygen.

The scanning type exposure apparatus according to the present invention includes the subsidiary chamber for isolating the reticle stage from the air flow for air-conditioning the inside of the chamber. Accordingly, it is possible to avoid variation in air flow in the chamber and variation in temperature around the projection optical system PL, which would be otherwise caused by the movement of the reticle stage in the scanning direction. Thus it is possible to provide stable image formation characteristics. In the scanning type exposure apparatus according to the present invention, the optical path of the interferometer for the reticle stage and the surroundings of the reticle stage including the optical path between the reticle and the projection optical system are enclosed by the partition walls. Accordingly, it is possible to avoid occurrence of temperature-dependent fluctuation on the optical path of the interferometer so that the distance-measuring error of the interferometer may be minimized. Further, the partition walls prevent the reticle stage and the reticle from contamination which would by otherwise caused by dust or the like.

Second Embodiment

Figure 4:
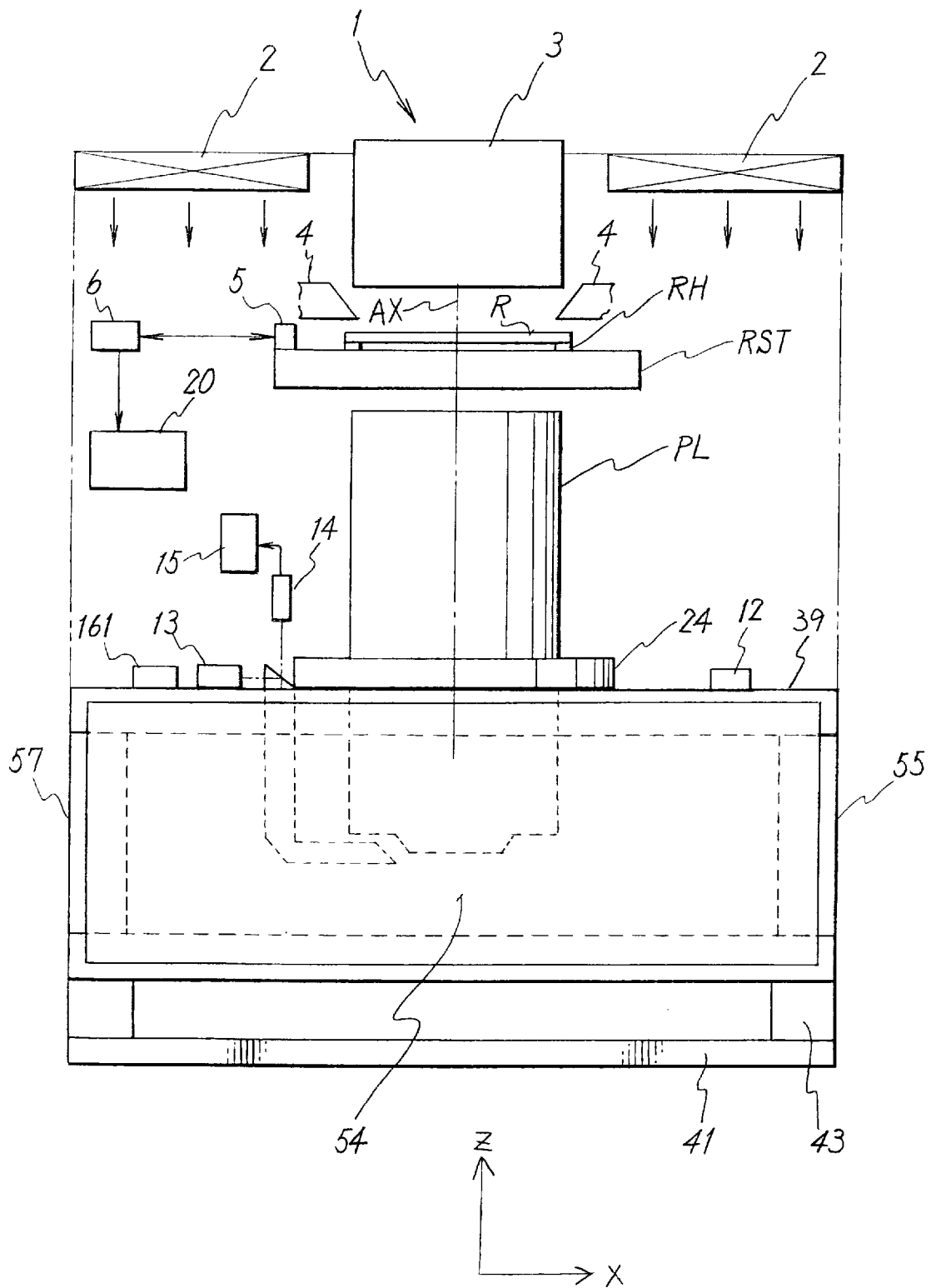
FIG. 4 schematically shows a scanning type exposure apparatus according to a second embodiment of the present invention.
Figure 5:
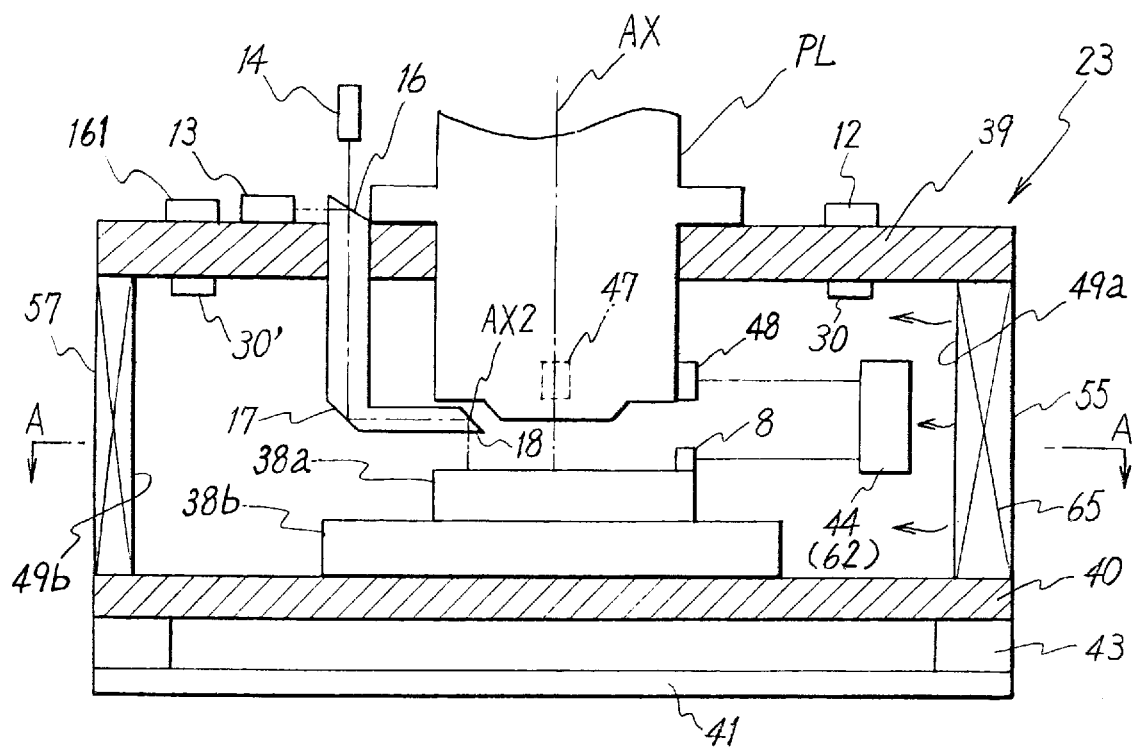
FIG. 5 shows a cross-sectional view illustrating the inside of a pedestal for supporting a projection optical system of the projection exposure apparatus shown in FIG. 4.
Figure 6:
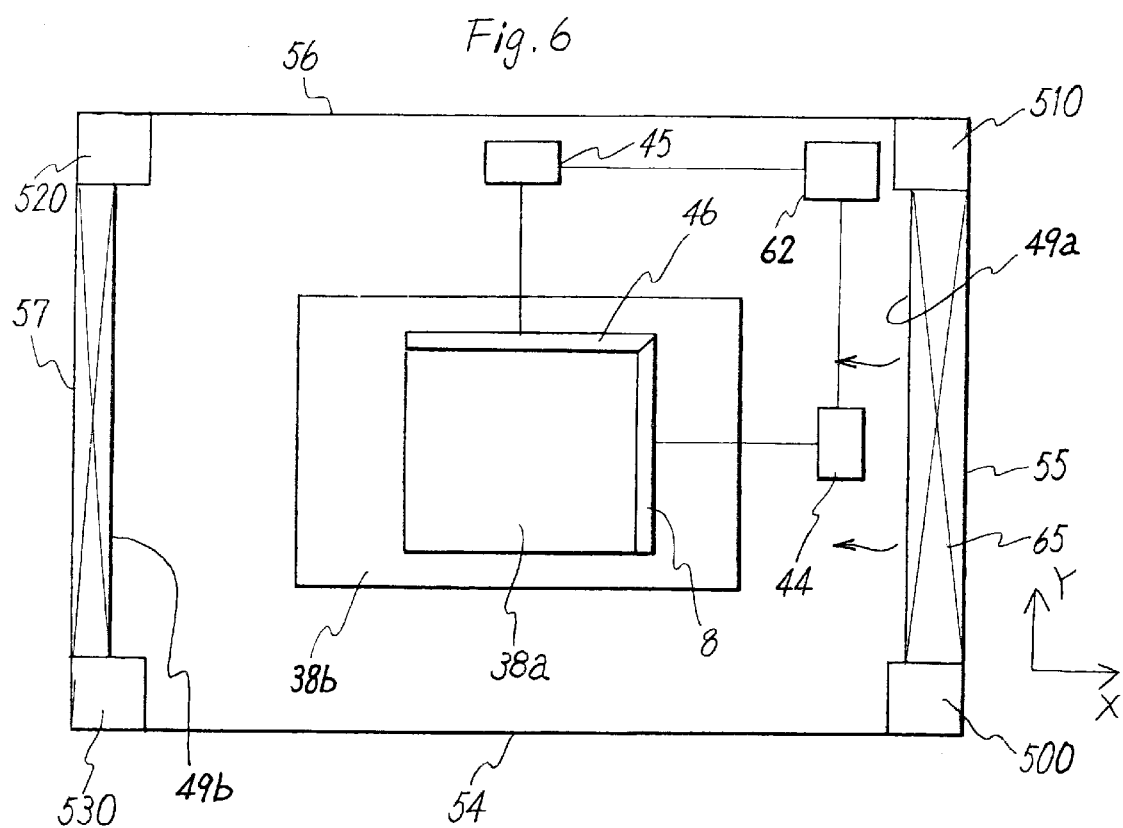
FIG. 6 shows a plan view of the inside of the pedestal, as viewed in a direction indicated by arrows AA in FIG. 5.

This embodiment specifically illustrates an example of the projection exposure apparatus provided with a mechanism capable of avoiding temperature-dependent fluctuation of a stage space inside a pedestal on which a substrate stage is installed. FIGS. 4 to 6 exemplarily show a scanning type projection exposure apparatus for performing exposure while synchronously scanning a reticle R and a wafer W with respect to an illumination area on the reticle R. The scanning type projection exposure apparatus principally comprises a light source (not shown), an illuminating optical system (not shown), a reticle stage RST for moving the reticle R in a scanning direction, a projection optical system PL for projecting an image of a pattern formed on the reticle R onto a wafer W, a wafer stage WST for moving the wafer W in synchronization with scanning for the reticle R, an alignment system 13 to 18 for positional adjustment for the wafer W, and a pedestal 23 for supporting the projection optical system PL. These principal components are installed in a constant temperature chamber 1 except for the light source and the illuminating optical system. The temperature is controlled more accurately in the constant temperature chamber 1 than in an ordinary clean room in the same manner as the projection exposure apparatus of the first embodiment. For example, the temperature is controlled in the clean room in a range of ±2° to ±3° C., while the temperature is kept in the constant temperature chamber 1 in a range of about ±0.1° C. The illustrated projection exposure apparatus is a projection exposure apparatus of the down flow type. Air flow-blowing ports 2 are installed on a ceiling of the chamber 1 in order to prevent the apparatus from adhesion of particles flowing in the air. A temperature-controlled air flow flows from the blowing ports 2 in a direction toward a floor of the chamber along an optical axis of the projection optical system PL. In order to prevent the chamber 1, especially a main exposure apparatus body including the projection optical system PL from inflow of, for example, contaminants (dust), sulfate ion, and ammonium ion floating in the clean room, a HEPA (or ULPA) filter and a chemical filter are arranged in the vicinity of an air intake port or the blowing ports 2 of the chamber 1.

In the main projection exposure apparatus body, the light source and the illuminating optical system are generally arranged over the reticle stage RST. Those usable as the illuminating light source include, for example, i-ray or g-ray as a bright line of an ultra-high voltage mercury lamp, a KrF or ArF excimer laser beam, and a light beam in an ultraviolet region such as a metal vapor laser beam. The illuminating optical system comprises, for example, a fly's eye lens for achieving a uniform illuminance, a shutter for opening and shutting an optical path, a variable blind for restricting an illumination area, and a relay lens. The reticle R, on which a circuit pattern or the like is depicted, is illuminated with an illuminating light beam from the light source and the illuminating optical system at a substantially uniform illuminance and at a predetermined solid angle. Recently, in order to increase the resolving power, the system is capable of performing, for example, zonal illumination and oblique illumination.

The reticle stage RST is installed over the projection optical system PL. The reticle stage RST is movable in the scanning direction (X direction) at a predetermined scanning velocity (Vr) by the aid of a reticle-driving unit (not shown) comprising, for example, a linear motor. The reticle stage RST is provided with a movement mirror 5 fixed at an end thereof in the X direction for reflecting a laser beam coming from an interferometer 6. The position of the reticle stage RST in the scanning direction is measured, for example, in a unit of 0.01 $\mu$m by the aid of the interferometer 6. A result of measurement obtained by the interferometer 6 is fed to a stage controller 20 so that the reticle stage RST is always positioned with a high degree of accuracy. A reticle holder RH is installed on the reticle stage RST. The reticle R is placed and attracted on the reticle holder RH by the aid of a vacuum chuck or the like. Reticle alignment systems 4, which are opposed to one another with the optical axis AX interposed therebetween, are installed over the reticle stage RST. The reticle alignment systems are used to observe a reference mark formed on the reticle R, and the initial position of the reticle stage RST is determined so that the reticle R is positioned at a predetermined reference position with a high degree of accuracy. Therefore, the position of the reticle R can be adjusted with a sufficient degree of accuracy only by measuring the position of the reticle stage RST by using the movement mirror 5 and the interferometer 6.

The reticle R is irradiated on the reticle stage RST with a rectangular (slit-shaped) illumination area with its long side extending in a direction (Y direction) perpendicular to the scanning direction (X direction) of the reticle R. The illumination area is defined by a field diaphragm (not shown) arranged in a plane conjugate to the reticle R or in the vicinity thereof over the reticle stage.

The illuminating light beam transmitted through the reticle R comes into the projection optical system PL. The reticle pattern in the slit-shaped illumination area (with its center substantially coincident with the optical axis AX) on the reticle R is projected onto the wafer W through the projection optical system PL. The image of the pattern on the reticle R, which is projected onto the wafer W, has a projection magnification determined by a magnification and an arrangement of lens elements of the projection optical system PL. Usually, the pattern is reduced into ⅕ or ¼ by the projection optical system PL. The projection optical system PL accommodates a plurality of the lens elements to use the optical axis AX as a common optical axis. The projection optical system PL is provided with a flange 24 at its central portion of its outer circumference in the direction of the optical axis. The projection optical system PL is secured to the pedestal 23 of the main exposure apparatus body by the aid of the flange 24.

The scanning type exposure apparatus is provided with a wafer alignment system for performing exposure while accurately superimposing a new pattern on a previously exposed pattern on the wafer W. An optical wafer alignment system 13 to 18 is used as the wafer alignment system. The optical wafer alignment system 13 to 18 is provided separately from the projection optical system PL as shown in FIG. 5 which is a cross-sectional view of a lower part of the projection exposure apparatus. Thus a position of a positional adjustment mark on the wafer W is read to determine a position at which overlay exposure is performed. Those usable as a light source 13 include, for example, a laser and a halogen lamp which emit a light beam having a wavelength to which a photoresist film on the wafer W is not sensitive. An illuminating light beam radiated from the light source 13 passes via a half mirror 16 and a mirror 17. The positional adjustment mark on the wafer W is illuminated with the illuminating light beam by the aid of a mirror 18. A reflected light beam or a diffracted light beam coming from the positional adjustment mark on the wafer W passes via a passage opposite to that used by the illuminating light beam. The light beam passes via the half mirror 16, and it is photoelectrically converted by a light-receiving unit 14. A signal from the light-receiving unit 14 is amplified into a sufficient output by an amplifier 15. An amplified signal is fed to an unillustrated alignment control system. The light source 13 is installed on the pedestal 23, which may serve as a heat source to raise the temperature of a top plate of the pedestal.

The wafer stage WST for moving the wafer W is installed at the inside of the pedestal 23. In the projection exposure apparatus of the present invention, side faces of the pedestal 23 are enclosed by partition walls 54 to 57 as shown in FIG. 4. Accordingly, the wafer stage WST installed at the inside of the pedestal will be explained with reference to FIG. 5. FIG. 6 is a view as viewed in a direction indicated by arrows AA in FIG. 5, illustrating a plan view of the wafer stage WST. The wafer stage WST is installed on a basement 40 of the pedestal 23. A wafer holder (not shown) is provided on the wafer stage WST. The wafer W is vacuum-attracted by the wafer holder. The wafer stage WST comprises an X stage 38a which is movable in the X direction, and a Y stage 38b which is movable in the Y direction. Thus the wafer W is not only movable in the scanning direction (X direction) described above but also movable in the direction (Y direction) perpendicular to the scanning direction to make it possible to scan and expose each of a plurality of shot areas on the wafer W. The wafer stage WST repeats the operation to scan each of the shot areas on the wafer W and the operation to move to an exposure start position of the next shot area. The wafer stage WST is also finely movable in the direction of the optical axis AX of the projection optical system PL (Z direction). Further, the wafer stage WST is inclinable with respect to the optical axis AX by the aid of an unillustrated leveling stage. The wafer stage WST is driven by a wafer stage-driving unit (not shown) such as a motor. The wafer W and the reticle R are in a relationship of inverted image through the projection optical system PL. Accordingly, when the reticle R is scanned at a velocity Vr during exposure in the −X direction (or +X direction), the wafer W on the wafer stage WST is scanned at a velocity Vw in synchronization with the reticle R in the +X direction (or −X direction) opposite to the direction of the reticle stage RST. The ratio between the movement velocities (Vr/Vw) of the reticle stage RST and the wafer stage WST is determined by the reduction magnification of the projection optical system PL. The wafer stage-driving unit is controlled by the stage controller 20 (FIG. 4), and the wafer stage WST is driven so that it is synchronized with the reticle stage RST.

A movement mirror 8 for reflecting a laser beam from an interferometer 62 is secured to an end of the wafer stage WST. The laser beam from the interferometer 62 is divided into two beams by a beam splitter 44. One beam goes toward the movement mirror 8 on the wafer stage WST, and the other beam goes toward a fixed mirror 48 installed on an outer circumference of a lower end of the projection optical system PL (see FIG. 5). A phase difference between reflected light beams from the movement mirror 8 and the fixed mirror 48 is detected by the interferometer. Thus the coordinate position of the wafer stage WST in the X direction is always monitored. As for the coordinate position in the Y direction, a movement mirror 46 is installed at an end of the wafer stage WST in the Y direction, and another fixed mirror 47 is installed on the outer circumference of the lower end of the projection optical system PL. The coordinate position in the Y direction is measured by irradiating the movement mirror 46 and the fixed mirror 47 with laser beams from a beam splitter 45, and detecting a phase difference between reflected beams thereof. The XY coordinate position of the wafer stage WST is detected by the interferometer 62, for example, with a resolving power of about 0.01 μm. A laser beam source 12 of the interferometer 62 is arranged on the top plate 39 of the pedestal, which serves as a heat source to raise the temperature of the top plate 39 of the pedestal. The laser beam source 12 and an electric substrate 161 for the stage controller 20 are also installed on the top plate 39 of the pedestal, which also serve as heat sources in the same manner as described above.

In the present invention, optical paths between the beam splitters 44, 45, the movement mirrors 8, 46, and the fixed mirrors 48, 47 in the pedestal 23 are included in an internal space of the pedestal 23. Namely, the areas between mutually adjacent support columns (500, 510, 520, 530) of the pedestal 23 is enclosed by the partition walls 54, 55, 56, 57. The interior of the pedestal 23 forms a closed space by the aid of the partition walls 54 to 57, the top plate 39 of the pedestal, and the basement 40. A blower 65 and its gas-blowing port 49a are provided on one partition wall 55 in the X direction, from which a temperature-controlled gas is supplied. A HEPA (or ULPA) filter and a chemical filter are installed at the gas-blowing port 49a in order to prevent the inside of the pedestal from inflow of active chemical substances or the like. For example, air can be used as the gas to be supplied. However, when a far ultraviolet laser beam source is used, it is preferred to use nitrogen or helium in order to avoid production of excited state oxygen from air. The gas to be supplied is controlled to have a set temperature as described later on by the aid of a temperature controller (not shown) provided in the blower 65. A discharging port 49b is provided on the other partition wall 57 in the X direction. The discharged gas is recycled to the blower 65 through the outside of the chamber 1. The gas is temperature-controlled again to have the set temperature, and the gas is supplied to the inside of the pedestal through the gas-blowing port 49a.

With reference to FIG. 5, temperature sensors 30, 30' are arranged at inner two positions on the top plate 39 of the pedestal 23, with which temperatures of the inner portions on the top plate 39 can be measured respectively. Such temperature sensors 30, 30' are preferably installed at inner portions on the top plate 39 corresponding to positions at which the temperature is relatively raised due to the existence of the heat sources on the top plate 39, because of the following reason. Namely, the gas, which has a temperature substantially equal to the temperature of such a high temperature portion, is supplied to the inside of the pedestal. Thus the temperature in the pedestal can be uniformalized. In this embodiment, the temperature sensors 30, 30' are installed at the inner portions on the top plate 39 of the pedestal corresponding to the positions at which the laser beam source 13 and the electric substrate 161 for the alignment system 13 to 18 and the laser beam source 12 for the interferometer for the wafer stage are installed respectively. Information on temperature measured by the temperature sensors 30, 30' is fed to the temperature controller of the blower 65, and an average temperature of those obtained by the two temperature sensors is determined by the temperature controller. The gas supplied to the inside of the pedestal 23 is controlled to have the determined average temperature. The temperature of the gas supplied to the inside of the pedestal is controlled, and the temperature of the inside of the pedestal is uniformalized as described above. Thus it is possible to avoid the temperature-dependent fluctuation on the optical path of the interferometer for the wafer stage WST installed at the inside of the pedestal.

In the foregoing embodiment, the optical paths of the interferometers for measuring the coordinate of the wafer stage in the XY directions have been explained. However, when the position of the wafer stage in the Z direction is subjected to distance measurement by using an interferometer, an optical path of the interferometer is also included in the internal space of the pedestal which is temperature-controlled as described above. Accordingly, the Z coordinate of the wafer stage can be measured with a high degree of accuracy. In the foregoing embodiment, the temperature of the top plate 39 of the pedestal has been measured at the two positions. However, the temperature may be measured at one position or three or more positions. The temperature of the gas supplied to the inside of the pedestal may be controlled so that the gas has a measured temperature or an average temperature of measured temperatures. When a plurality of temperature sensors are provided, it is preferred that the plurality of temperature sensors are provided between the gas-supplying means and the vicinity of the optical path of the interferometer, and the temperature of the gas is adjusted to be an average temperature of those obtained by the plurality of sensors, in order to avoid the temperature-dependent fluctuation of the gas on the optical path of the interferometer as described above.

In the foregoing embodiment, the present invention has been explained based on the use of the scanning type projection exposure apparatus. However, the present invention can be applied to an arbitrary projection exposure apparatus having an interferometer system for a wafer stage, such as a step-and-repeat type projection exposure apparatus of the collective exposure system. Instead of the air for air-conditioning the entire chamber outflowing from the air-blowing ports 2, it is preferred to use nitrogen or helium especially when a far ultraviolet laser beam is used as the light source.

Third Embodiment

This embodiment specifically illustrates a projection exposure apparatus having a structure which makes it possible to avoid temperature-dependent fluctuation of a stage space inside a pedestal, and avoid heat transfer to the stage space from heat sources installed on the pedestal.

Figure 7:
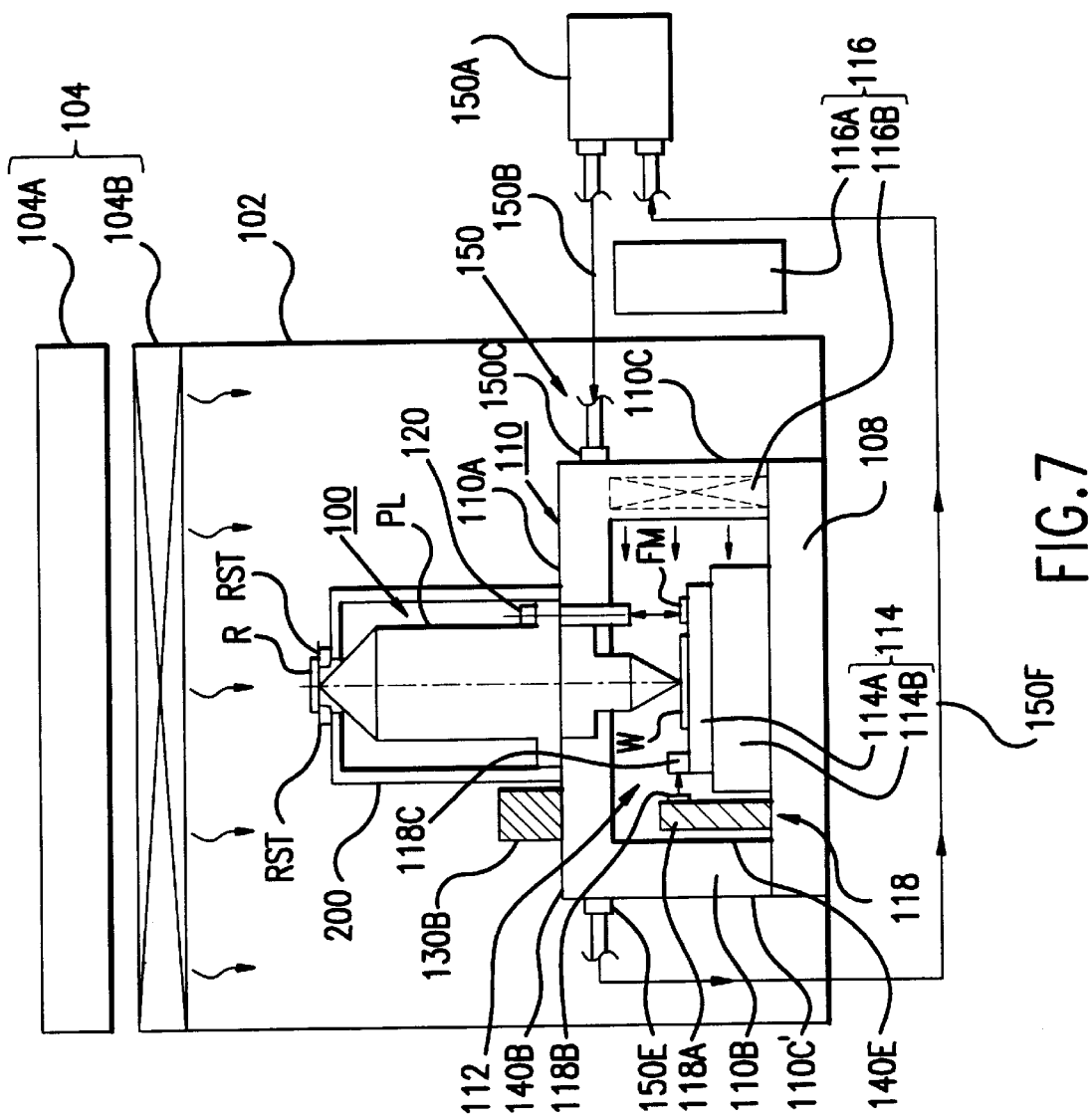
FIG. 7 schematically shows an arrangement of a projection exposure apparatus according to a third embodiment of the present invention.

FIG. 7 schematically shows an arrangement of such a projection exposure apparatus 100. As shown in FIG. 7, the projection exposure apparatus 100 is accommodated in a clean chamber 102. An air-conditioning system 104 comprising, for example, an air conditioner 104A and a filter unit 104B is installed on a ceiling of the clean chamber 102. The air conditioner 104A comprises, for example, an air supply fan and a temperature controller (not shown) to supply air temperature-controlled at a predetermined temperature, for example, 23° C. to 25° C. The filter unit 104B includes, for example, a chemical filter and a HEPA filter (not shown), which removes organic substances and dust from the air temperature-controlled at the predetermined temperature by the air conditioner 104A. Thus clean air having the predetermined temperature and a predetermined cleanliness is supplied as a laminar flow of down flow to the inside of the clean chamber 102. The clean air supplied to the inside of the clean chamber 102 is discharged through a large number of discharging holes (not shown) formed on a floor surface. Thus the clean air, which is temperature-controlled at the predetermined temperature, circulates in the clean chamber 102.

A basement 108 is installed on the floor surface of the clean chamber 102. A main apparatus body of the projection exposure apparatus 100 is installed on the basement 108. The projection exposure apparatus 100 is provided with a pedestal 110 which is fixed on the basement 108. A projection optical system PL and an upper pedestal 200 for supporting a reticle stage RST are secured to the pedestal 110. In order that the arrangement of the apparatus is comprehensively understood, an illuminating optical system and an illuminating light source for illuminating a reticle R with a uniform illuminating light beam are omitted from the illustrated embodiment. As shown in FIG. 7, the pedestal 110 includes a substantially rectangular top plate 110A and columns 110B for supporting the top plate 110A at four corners. Partition walls 110C are formed between the columns 110B. A wafer stage 114 is installed in a space (hereinafter referred to as "stage space") surrounded by the top plate 110A, the columns 110B, and the partition walls 110C.

This exposure apparatus 100 is provided with a local air-conditioning system 116 for keeping the stage space 112 for installing the wafer stage 114 therein at a predetermined temperature and a predetermined cleanliness. The local air-conditioning system 116 principally comprises a local air conditioner 116A and a local filter unit 116B. The local air conditioner 116A is installed outside the clean chamber 102, and it includes, for example, an air supply fan and a temperature controller (not shown). The local filter unit 116B is installed on one partition wall 110C for surrounding the stage space 112, and it includes, for example, a chemical filter and a HEPA filter. Unillustrated discharging holes are provided through the partition wall 110C' disposed on a side opposite to the partition wall 110C on which the local filter unit 116B is installed. The local air conditioner 116A has a high degree of accuracy of temperature control, making it possible to keep the temperature in the stage space 112 at a predetermined temperature, for example, 20° C. to 23° C. Temperature-controlled air supplied from the local air conditioner 116A is subjected to removal of organic substances and dust by the aid of the local filter unit 116B. The air flows through the stage space 112, as a laminar flow of clean air having the predetermined temperature and the predetermined cleanliness. The air is discharged from the discharging holes disposed on the opposing surface. Thus the clean air, which is temperature-controlled to have the predetermined temperature, circulates in the stage space 112 by the aid of the air-conditioning system which is different from that for the clean chamber 102.

In this embodiment, the stage space 112 is the closed space isolated by the partition walls 110C, the columns 110B, and the top plate 110A. However, the stage space 112 may be an open space. Namely, it is sufficient that the temperature in the stage space 112 can be controlled independently from the temperature in the clean chamber 102, by using the local air-conditioning system 116 which is provided as a system different from the air-conditioning system 104 for the clean chamber 102. As described later on, those arranged in the stage space 112 include heat sources such as a laser head 130B, as well as a distance-measuring system 118 and an alignment microscope 120 for constituting an alignment system which are apt to be badly affected by inflow of a quantity of heat. However, according to the structure of the projection exposure apparatus of this embodiment, it is possible to keep the stage space 112 in a state of constant temperature with a high degree of accuracy. Accordingly, it is possible to improve measurement accuracies of the distance-measuring system 118 and the alignment system. It is noted that an autofocus mechanism (not shown) or the like is also installed in the stage space 112. The accuracy of such an autofocus mechanism can be also improved according to this embodiment.

The wafer stage 114, which is installed in the stage space 112, includes an X stage 114A and a Y stage 114B. A photosensitive substrate W such as a wafer is held on the wafer stage 114, which is finely rotatable thereon. Positional adjustment can be performed highly accurately at a desired position by driving the X stage 114A and the Y stage 114B by the aid of unillustrated driving mechanisms. A fiducial plate FM, which includes an alignment mark having a predetermined shape, for example, a cross-shaped alignment mark affixed thereon, is installed on the wafer stage 114. The alignment mark is observed by using the alignment microscope 120 installed on an outer barrel of the projection optical system PL. Thus it is possible to adjust the position of the wafer W held on the wafer stage 114. In the illustrated embodiment, only the alignment microscope 120 is shown, and other optical systems included in the alignment system are omitted. The alignment system, to which the present invention is applicable, is not limited to those of the off-axis system based on the use of the alignment microscope 120. The present invention is applicable to various alignment systems.

A distance-measuring system 118 such as a laser interferometer 118A is provided in order to measure the position of the wafer stage 114 with a high degree of accuracy. A movement mirror 118C is provided at an end of each of the stages. The movement mirror 118C installed on each of the stages is irradiated with a laser beam coming from a laser head 130B by the aid of the laser interferometer 118A. A reflected light beam thereof is received by an unillustrated light-receiving element so that an accurate position coordinate of the wafer stage 114 is measured. In the illustrated embodiment, only the laser interferometer 118A for measuring the X coordinate of the wafer stage 114 is shown. Laser interferometers for measuring the rotation and the Y coordinate of the wafer stage 114 are omitted.

The laser interferometer 118A is provided for measuring a relative position of the wafer stage 114 with respect to a fixed mirror installed on a projection lens. Therefore, it is necessary for the laser interferometer 118A to be installed on the basement 108 common to the wafer stage 114 in the stage space 112. However, the laser interferometer 118A, especially its laser head 130B radiates a high energy laser beam. Accordingly, it serves as a heat source to raise the temperature of the pedestal. As a result, air and parts in the vicinity of the heat source is warmed, and it is feared that harmful influences may be exerted on the distance-measuring system 118 and the alignment system, such as occurrence of fluctuation of air in the optical path of the beam of the laser interferometer 118A. However, according to the arrangement of this embodiment, the local air-conditioning system 116 allows highly accurately temperature-controlled clean air to circulate in the stage space 112. Thus it is possible to suppress and minimize the harmful influence caused by the heat source existing in the stage space 112. Preferably, the distance-measuring system 118 and the alignment system, which are sensitive to change in temperature, are installed on an upstream side in the direction of the flow of clean air fed from the local air-conditioning system 116, rather than the heat source such as the laser head 130B.

Figure 8:
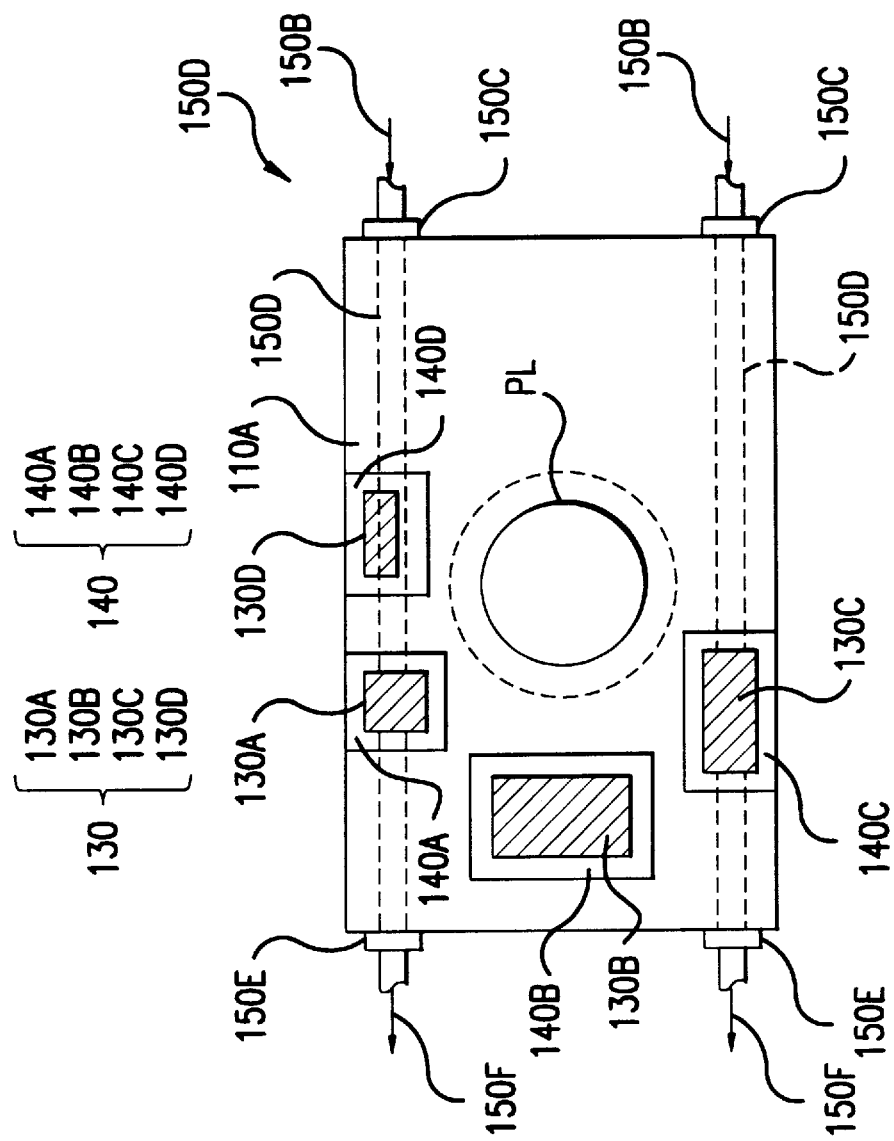
FIG. 8 schematically shows a plan view of a top plate of a pedestal of the projection exposure apparatus shown in FIG. 7.

FIG. 8 shows a plan view of the top plate 110A of the pedestal 110. As shown in FIG. 8, the projection optical system PL is installed at a substantially central portion of the top plate 110A. The projection optical system PL is provided for reducing and projecting an image of a pattern on the reticle R illuminated with an exposure light beam (for example, i-ray or g-ray) coming from the unillustrated illuminating optical system, onto the wafer W placed on the stage 114 installed in the stage space 112. The reticle R is placed on the reticle stage RST. The reticle stage RST is placed on the upper pedestal 200 provided on the pedestal 110. Those installed on the top plate 110A include, for example, various controllers such as a control box 130A for performing lens control and control of movement of the wafer stage, light sources such as the laser head 130B, electric substrates such as a substrate 130C, and sensors such as an atmospheric pressure sensor 130D. These instruments 130 should be placed in the vicinity of instruments to be connected therewith because of a reason to counteract noise or the like. They are collectively installed on the top plate 110A in view of their spaces for installation. However, these instruments 130 generate heat during their operation, and they serve as heat sources. In the conventional apparatus, a quantity of heat generated from the heat sources is transferred through the pedestal 110. The transferred heat warms air at the inside of the stage space 112, and it badly affects measurement accuracies of the distance-measuring system 118 and the alignment system installed in the stage space 112. On the contrary, the apparatus of this embodiment adopts the following means to deal with the heat so that the heat generated by the heat sources 130 installed on the top plate 110A is not transferred to the stage space 112.

A first means to deal with the heat is the provision of a heat insulating material 140 for intercepting the heat transfer passage from the outside to the stage space. The heat insulating material 140 may intervene between the top plate 110A and the instruments 130A to 130D which serve as the heat sources, as shown by reference numerals 140A to 140D in FIG. 8. Accordingly, it is possible to intercept the heat transfer passage through which the heat generated by the instruments 130A to 130D to serve as the heat sources would be directly transferred to the top plate 110A. In the illustrated embodiment, the heat insulating material is arranged at only places at which the instruments 130A to 130D are installed. However, the heat insulating material may be arranged so that a substantially entire surface of the top plate 110A is covered therewith. As for other heat sources installed on portions of the pedestal other than the top plate 110A, it is needless to say that the heat insulating material may intervene between the heat sources and the portions of the pedestal. The heat insulating material 140 may be arranged at surface portions of the pedestal 110 contacting with the stage space 112 as shown by a reference numeral 140E in FIG. 7. Accordingly, the stage space 112 is isolated from the heat transferred through the pedestal 110. Thus it is possible to stabilize the temperature in the stage space 112 with a high degree of accuracy. Those usable as the heat insulating material arranged on the pedestal include, for example, polycarbonate.

A second means to deal with the heat is that a temperature control unit 150 for adjusting the temperature of the pedestal 110 is provided in the pedestal 110 itself. FIGS. 7 and 8 show an example of the temperature control unit 150. The temperature control unit 150 includes a heating medium source 150A. A heating medium such as an inert liquid (for example, fluoric inert liquid), which is highly accurately temperature-controlled by the heating medium source 150A, is fed to inflow joints 150C provided on the pedestal 110, through feeding tubes 150B. Heating medium-circulating tubes 150D are formed in the top plate 110A of the pedestal 110. The temperature of the pedestal 110 is temperature-controlled with a high degree of accuracy in accordance with circulation of the heating medium through the heating medium-circulating tubes 150D. The heating medium outflows from outflow joints 150E to the outside of the pedestal 110. The heating medium is returned to the heating medium source 150A through return tubes 150F. After that, the heating medium is temperature-controlled again, and it is fed to the pedestal 110. As described above, the temperature of the pedestal 110 itself is adjusted by using the temperature control unit 150. Thus it is possible to stabilize the temperature of the stage space 112 surrounded by the pedestal 110.

Figure 9:
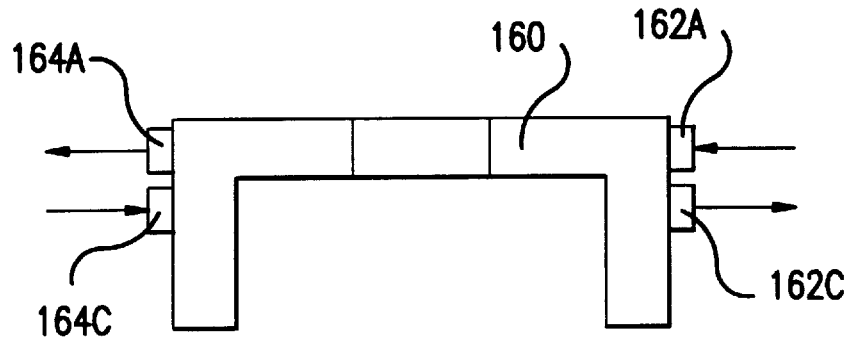
FIG. 9 schematically shows a side view of a modified embodiment of the pedestal applicable to the projection exposure apparatus shown in FIG. 7.
Figure 10:
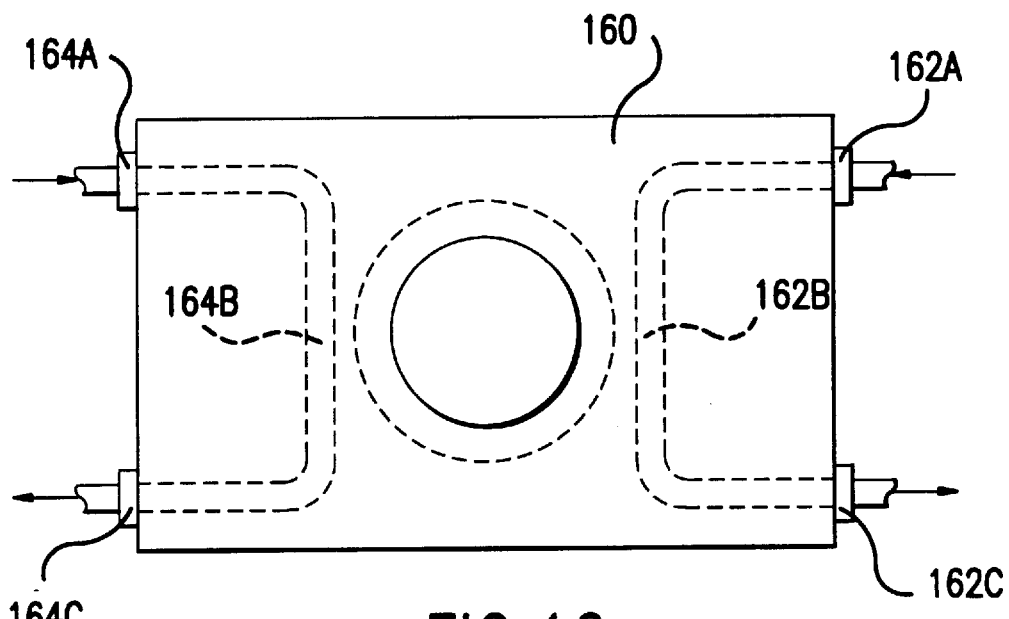
FIG. 10 schematically shows a plan view of a top plate of the pedestal shown in FIG. 9.

In the embodiment shown in FIG. 8, the two straight heating medium-circulating tubes 150D are arranged to interpose the projection optical system PL vertically as viewed in the drawing, and the heating medium is allowed to flow from the left to the right in the drawing. However, the present invention is not limited to such an embodiment. For example, as shown in FIGS. 9 and 10, an arrangement may be made such that U-shaped tubes 162B, 164B are arranged in the pedestal 160, and the heating medium is allowed to circulate through inflow joints and outflow joints 162A, 162C, 164A, 164B, each pair being arranged on an identical side of the pedestal 160. Accordingly, the pedestal 160 may includes an arbitrary number of tubes having any arbitrary shape arranged at arbitrary positions therein. Especially, the change in temperature of the pedestal 160 can be effectively avoided by arranging the heating medium-circulating tube in the vicinity of a portion at which the instrument to serve as the heat source is installed.

Figure 11:
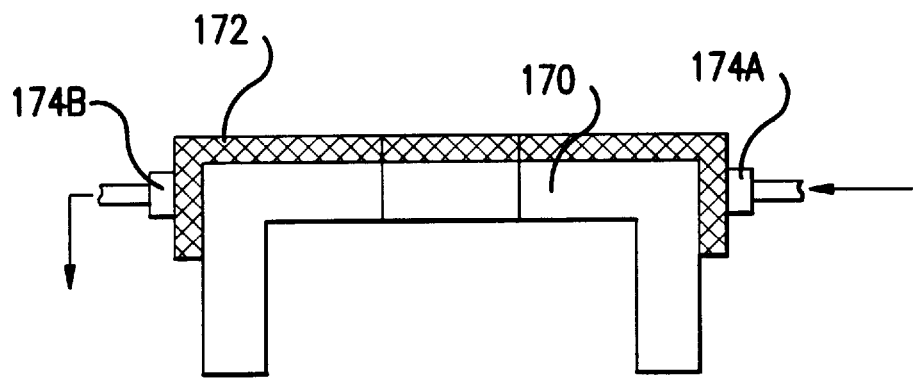
FIG. 11 schematically shows a side view of another modified embodiment of the pedestal applicable to the projection exposure apparatus shown in FIG. 7.
Figure 12:
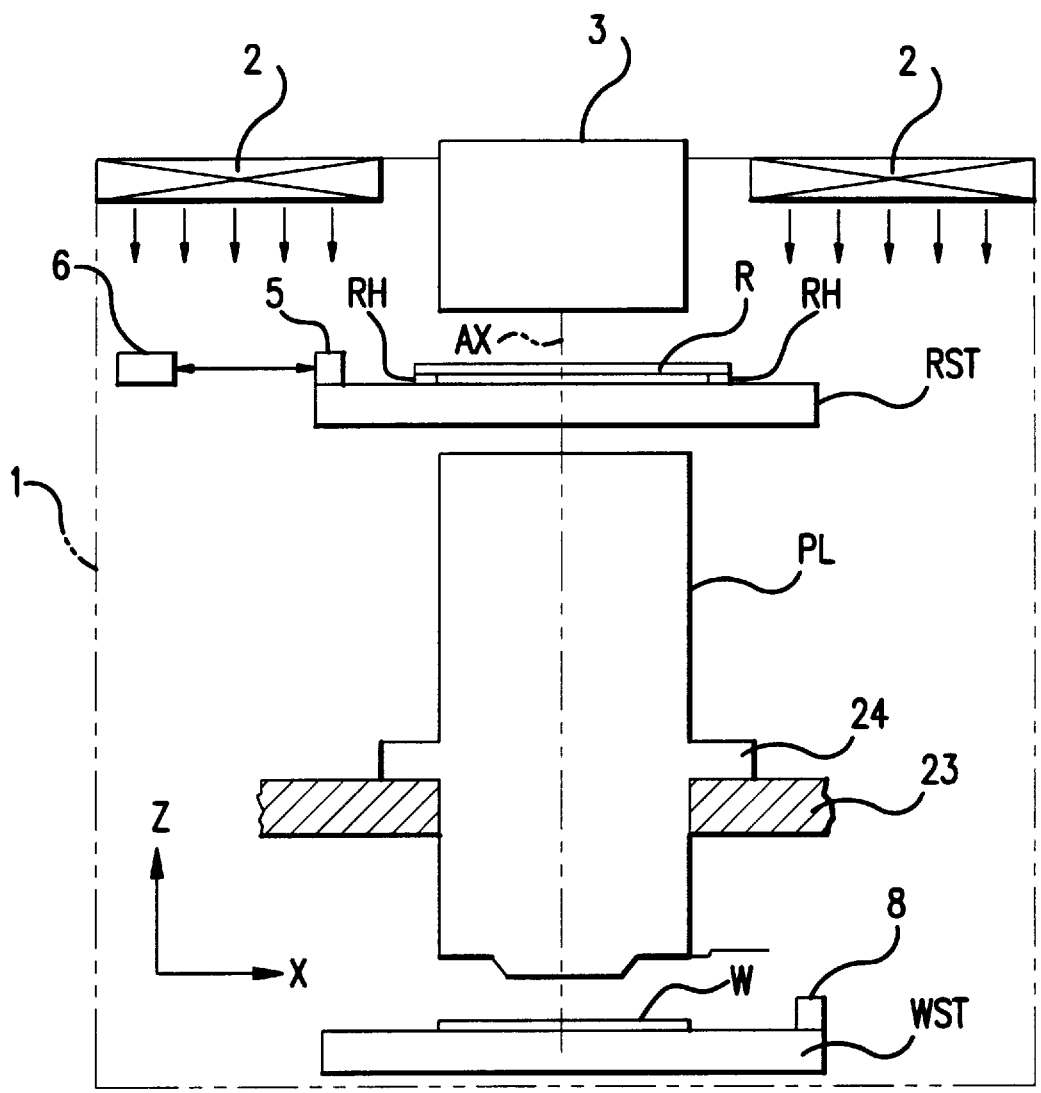
FIG. 12 schematically shows a conventional scanning type projection exposure apparatus and an air-conditioning system thereof.

In the foregoing embodiment, the heating medium-circulating tube is arranged at the inside of the pedestal 160 in any case. However, as shown in FIG. 11, the following arrangement may be adopted. Namely, the upper surface of the pedestal 160 is covered with a jacket 172, and the heating medium is allowed to circulate in the jacket 172 through an inflow joint 174A and an outflow joint 174B. According to such an arrangement, even when it is difficult to form the heating medium-circulating tube at the inside of the pedestal 160, the temperature of the pedestal 160 can be adjusted to avoid inflow of the heat into the stage space 112.

In the embodiment shown in FIGS. 7 and 8, the both of the heat insulating material 140 and the temperature control unit 150 are installed for the pedestal 160. However, it is not necessarily indispensable to use the both means to deal with the heat. Any one of the means to deal with the heat may be applied to the pedestal. The foregoing embodiment illustrates only the means to deal with the heat for the lower pedestal 160 for supporting the projection optical system PL. However, the means to deal with the heat may be applied to the upper pedestal 200 for supporting the reticle stage, if necessary.

The exposure apparatus of the present invention has been explained in accordance with the first to third embodiments. However, the present invention is not limited thereto. Especially, for example, the shape and the arrangement of the partition wall and the subsidiary chamber for enclosing the reticle stage and the optical path of the laser interferometer, and the structure of the tube formed in the pedestal are not limited to those described in the embodiments. All alterations and modifications thereof conceivable by those skilled in the art are included in the scope of the present invention.

What is claimed is:

1. A scanning type exposure apparatus for transferring an image of a pattern formed on a mask onto a photosensitive substrate by synchronously scanning the mask and the photosensitive substrate with respect to an illumination area on the mask while illuminating the mask including the pattern formed thereon, comprising:

a chamber for accommodating the apparatus;

a first gas conditioner for allowing a temperature-controlled gas to flow in the chamber;

a mask stage for holding and moving the mask; and a partition wall for intercepting the gas which would otherwise go toward the mask on the mask stage.

2. The scanning type exposure apparatus according to claim 1, wherein the mask stage is substantially enclosed by the partition wall, and a part of the partition wall is composed of a member which is substantially transparent with respect to an illuminating light beam for illuminating the mask.

3. The scanning type exposure apparatus according to claim 1, further comprising a projection optical system for projecting the image of the pattern formed on the mask onto the photosensitive substrate, wherein the first gas conditioner allows the gas to flow from a position above the mask substantially in parallel to an optical axis of the projection optical system.

4. A scanning type exposure apparatus for transferring an image of a pattern formed on a mask onto a photosensitive substrate by synchronously scanning the mask and the photosensitive substrate with respect to an illumination area on the mask while illuminating the mask including the pattern formed thereon, comprising:

a chamber for accommodating the apparatus;

a first gas conditioner for allowing a temperature-controlled gas to flow in the chamber;

a mask stage for holding and moving the mask;

an optical measuring unit for measuring a position of the mask stage;

a partition wall for intercepting the gas which would otherwise go toward the mask stage and an optical path of the optical measuring unit; and a second gas conditioner for allowing a temperature-controlled gas to flow in a space partitioned by the partition wall and including the mask stage and the optical path of the optical measuring unit.

5. The scanning type exposure apparatus according to claim 4, further comprising a projection optical system for projecting the image of the pattern formed on the mask onto the photosensitive substrate, wherein an optical path between the projection optical system and the mask is enclosed by the partition wall.

6. The scanning type exposure apparatus according to claim 5, wherein the mask stage and the optical path of the optical measuring unit are substantially enclosed by the partition wall, and a part of the partition wall is composed of a member which is substantially transparent with respect to an illuminating light beam for illuminating the mask.

7. The scanning type exposure apparatus according to claim 5, wherein the first gas conditioner allows the gas to flow from a position above the mask substantially in parallel to an optical axis of the projection optical system.

8. The scanning type exposure apparatus according to claim 7, wherein the gas supplied by the first gas conditioner is mutually different in type from the gas supplied by the second gas conditioner.

9. The scanning type exposure apparatus according to claim 8, wherein at least one of the gas supplied by the first gas conditioner and the gas supplied by the second gas conditioner is an inert gas.

10. A projection exposure apparatus comprising:

a projection optical system for projecting an image of a pattern formed on a mask onto a photosensitive substrate;

a pedestal for supporting the projection optical system in the projection exposure apparatus;

a substrate stage arranged in an internal space of the pedestal, the substrate stage being capable of holding and moving the photosensitive substrate;

an optical measuring unit for measuring a position of the substrate stage; and a third gas conditioner for supplying a gas controlled to have a temperature which is substantially the same as a temperature of a pedestal surface contacting with the internal space of the pedestal, to the internal space including the substrate stage and an optical path of the optical measuring unit.

11. The projection exposure apparatus according to claim 10, further comprising a partition wall for isolating the internal space of the pedestal from the outside, and closing the internal space, wherein the third gas conditioner supplies the temperature-controlled gas to the closed internal space.

12. The projection exposure apparatus according to claim 10, further comprising a heat insulating material, provided on at least a part of the pedestal, for intercepting heat transfer from the outside to the internal space of the pedestal.

13. The projection exposure apparatus according to claim 10, further comprising a mask stage for holding the mask and moving it in synchronization with the substrate stage, an optical measuring unit for measuring a position of the mask stage, and a gas conditioner for allowing a temperature-controlled gas to flow in a space including an optical path of the optical measuring unit.

14. The projection exposure apparatus according to claim 13, wherein the space including the optical path of the optical measuring unit for measuring the position of the mask stage is isolated by a partition wall from an external space.

15. The projection exposure apparatus according to claim 13, wherein the projection exposure apparatus is a scanning type projection exposure apparatus.

16. The projection exposure apparatus according to claim 10, further comprising an alignment system for positional adjustment for the photosensitive substrate and the mask, wherein a part of the alignment system exists in the internal space including the substrate stage and the optical path of the optical measuring unit.

17. The projection exposure apparatus according to claim 10, further comprising a temperature sensor on a pedestal surface contacting with the internal space, wherein the third gas conditioner supplies the gas which is controlled on the basis of a measured value obtained by the temperature sensor.

18. The projection exposure apparatus according to claim 17, further comprising a plurality of the same temperature sensors at different positions on the pedestal surface contacting with the internal space, wherein the third gas conditioner supplies the gas which is controlled on the basis of an average value of measured values obtained by the temperature sensors.

19. The projection exposure apparatus according to claim 10, wherein the third gas conditioner comprises a chemical filter for removing or inactivating chemical substances contained in the gas.

20. The projection exposure apparatus according to claim 10, further comprising an illuminating optical system for irradiating the mask with a far ultraviolet light beam, wherein the third gas conditioner uses, as the gas, one selected from the group consisting of air, nitrogen, and helium.

21. The projection exposure apparatus according to claim 10, wherein at least one of a light source for the optical measuring unit and an electric substrate for controlling movement of the substrate is installed on the pedestal.

22. The projection exposure apparatus according to claim 10, further comprising a first gas conditioner for allowing a temperature-controlled gas to flow from a position above the mask substantially in parallel to an optical axis of the projection optical system in order to maintain a substantially constant temperature in a chamber for accommodating the projection exposure apparatus.

23. A projection exposure apparatus comprising:
- a projection optical system for projecting an image of a pattern formed on a mask onto a photosensitive substrate;
- a pedestal for supporting the projection optical system in the projection exposure apparatus;
- a substrate stage arranged in an internal space of the pedestal, the substrate stage being capable of holding and moving the photosensitive substrate;
- an optical measuring unit for measuring a position of the substrate stage; and
- a heat insulating material, provided on at least a part of the pedestal, for intercepting heat transfer from the outside to the internal space of the pedestal including the substrate stage and an optical path of the optical measuring unit.

24. The projection exposure apparatus according to claim 23, wherein the heat insulating material is allowed to intervene between the pedestal and a heat source installed on the pedestal.

25. The projection exposure apparatus according to claim 24, wherein the heat source is at least one of a light source of the optical measuring unit and an electric substrate for controlling movement of the substrate stage.

26. The projection exposure apparatus according to claim 23, wherein the heat insulating material is provided on a substantially entire surface of the pedestal at the back of the internal space.

27. A projection exposure apparatus comprising:
- a mask-supporting mechanism for supporting a mask;
- a projection optical system for projecting an image of a pattern formed on the mask onto a photosensitive substrate;
- a pedestal for supporting the projection optical system in the projection exposure apparatus;
- a substrate stage arranged in an internal space of the pedestal, the substrate stage being capable of holding and moving the photosensitive substrate;
- an optical measuring unit for measuring a position of the substrate stage; and
- a temperature-adjusting unit for adjusting at least one of a temperature of the mask-supporting mechanism and a temperature of the pedestal.

28. The projection exposure apparatus according to claim 27, wherein the temperature-adjusting unit for adjusting the temperature of the pedestal keeps a substantially constant temperature of a pedestal surface contacting with the internal space of the pedestal.

29. The projection exposure apparatus according to claim 27, wherein the temperature-adjusting unit for adjusting the temperature of the pedestal comprises a flow passage formed in a top plate of the pedestal, and a fluid-supplying unit for supplying a temperature-controlled fluid to the flow passage.

30. The projection exposure apparatus according to claim 27, further comprising a heat insulating material, provided on at least a part of the pedestal, for intercepting heat transfer from the outside to the internal space of the pedestal.

31. The projection exposure apparatus according to claim 27, further comprising an alignment system for adjusting positions of the mask and the photosensitive substrate, wherein a part of the alignment system exists in the internal space of the pedestal.

32. The projection exposure apparatus according to claim 27, further comprising a third gas conditioner for supplying a temperature-controlled gas to the internal space of the pedestal.

33. The projection exposure apparatus according to claim 27, further comprising a chamber for accommodating the projection exposure apparatus, and a first gas conditioner for circulating a temperature-controlled gas in the chamber, wherein a temperature of the internal space and a temperature of the chamber are independently controlled.

34. A method for manufacturing an exposure apparatus that exposes a substrate with a pattern formed on a mask comprising:
- providing a chamber that accommodates the exposure apparatus;
- providing a first gas conditioner that supplies a temperature-controlled gas into the chamber;
- providing a mask stage that is movable while holding the mask thereon; and
- providing a partition wall, disposed between the first gas conditioner and the mask stage, the partition wall intercepting the gas that would otherwise flow toward the mask on the mask stage.

35. The method according to claim 34, wherein the exposure apparatus is a scanning type exposure apparatus that exposes the substrate by synchronously moving the mask and the substrate.

36. The method according to claim 34, wherein the first gas conditioner is disposed above the mask stage.

37. The method according to claim 34, further comprising providing a second gas conditioner that supplies a temperature-controlled gas into a space containing the mask stage and partitioned by the partition wall.

38. The method according to claim 34, further comprising providing a position detector disposed in a space including the mask stage therein and defined by the partition wall, wherein the position detector detects a position of the mask stage.

39. A method for manufacturing an exposure apparatus that exposes a substrate with a pattern formed on a mask comprising:
- providing a stage;
- providing a pedestal opposed to the stage; and
- providing a gas conditioner that controls a temperature in a space defined by the pedestal and the stage based on a temperature of a surface of the pedestal.

40. The method according to claim 39, wherein the stage is a substrate stage that holds the substrate thereon.

41. The method according to claim 39, wherein the pedestal supports a projection optical system that projects the pattern onto the substrate.

42. The method according to claim 39, further comprising providing a position detector that detects a position of the stage.

43. The method according to claim 42, wherein the detector has a first part disposed on the pedestal and a second part disposed in the space.

44. A method for manufacturing an exposure apparatus that exposes a substrate with a pattern formed on a mask comprising:
- providing a stage;
- providing a pedestal opposed to the stage; and
- providing a heat insulating material disposed on at least a portion of the pedestal, and which prevents a space defined by the pedestal and the stage from transferring heat with the outside thereof.

45. The method according to claim 44, wherein the stage is a substrate stage that holds the substrate thereon.

46. The method according to claim 44, wherein the pedestal supports a projection optical system that projects the pattern onto the substrate.

47. The method according to claim 44, further comprising providing a position detector that detects a position of the stage.

48. The method according to claim 44, further comprising providing a gas conditioner that controls a temperature in the space.

49. The method according to claim 44, further comprising providing an auto-focus mechanism installed in the space.

* * * * *